(12) United States Patent
Posseme et al.

(10) Patent No.: US 11,581,184 B2
(45) Date of Patent: Feb. 14, 2023

(54) METHOD OF ETCHING A LAYER BASED ON A III-V MATERIAL

(71) Applicant: COMMISSARIAT A L'ENERGIE ATOMIQUE ET AUX ENERGIES ALTERNATIVES, Paris (FR)

(72) Inventors: Nicolas Posseme, Grenoble (FR); Frédéric Le Roux, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 146 days.

(21) Appl. No.: 17/018,204

(22) Filed: Sep. 11, 2020

(65) Prior Publication Data

US 2021/0090880 A1 Mar. 25, 2021

(30) Foreign Application Priority Data

Sep. 12, 2019 (FR) .................................... 19 10110

(51) Int. Cl.
*H01L 21/02* (2006.01)
*H01L 21/265* (2006.01)
(Continued)

(52) U.S. Cl.
CPC ...... *H01L 21/0254* (2013.01); *H01L 21/2654* (2013.01); *H01L 21/3065* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| | | |
|---|---|---|
| 8,124,505 B1 | 2/2012 | Burnham et al. |
| 2016/0035581 A1* | 2/2016 | Posseme ........... H01L 21/31116 438/705 |
| 2017/0338122 A1 | 11/2017 | Daulton |

FOREIGN PATENT DOCUMENTS

WO WO 2014/102222 A1 7/2014

OTHER PUBLICATIONS

French Preliminary Search Report dated May 11, 2020 in French Application 19 10110 filed on Sep. 12, 2019 (with English Translation of Categories of Documents Cited & Written Opinion), 12 pages.

(Continued)

*Primary Examiner* — Jack S Chen
(74) *Attorney, Agent, or Firm* — Oblon, McClelland, Maier & Neustadt, L.L.P.

(57) ABSTRACT

A method for etching at least one layer of a gallium nitride (GaN)-based material is provided, the method including: providing the GaN-based layer having a front face; and at least one cycle including the following successive steps: modifying, by implanting hydrogen (H)- and/or helium (He)-based ions, at least some of a thickness of the GaN-based layer to form in the layer at least one modified portion extending from the front face, the implanting being carried out from a plasma, the modifying by implanting being carried out such that the modified portion extends from the front face and over a depth greater than 3 nm; oxidizing at least some of the modified portion by exposing the layer to an oxygen-based plasma, to define in the layer, at least one oxidized portion and at least one non-oxidized portion; and etching the oxidized portion selectively at the non-oxidized portion.

17 Claims, 6 Drawing Sheets

(51) Int. Cl.
*H01L 21/3065* (2006.01)
*H01L 29/66* (2006.01)
H01L 29/778 (2006.01)

(56) References Cited

OTHER PUBLICATIONS

Bizouerne et al., "Low damage patterning of $In_{0.53}Ga_{0.47}As$ film for its integration as n-channel in a fin metal oxide semiconductor field effect transistor architecture", Journal of Vacuum Science and Technology: Part A , vol. 36, No. 6, Nov. 16, 2018, 12 pages.
Pearton et al., "A Review of Dry Etching of GaN and Related Materials", MRS Internet Journal Nitride Semiconductor Research 5, 11, 2000, 38 pages.
Burnham et al., "Gate-recessed normally-off GaN-on-Si HEMT using a new $O_2$-$BCl_3$ digital etching technique", Phys. Status Solidi C 7, No. 7-8, 2010, 3 pages.
Lin et al., "A Novel Digital Etch Technique for p-GaN Gate HEMT", 2018 IEEE International Conference on Semiconductor Electronics (ICSE), 2018, 3 pages.
Marcon et al., "Chapter 3: GaN-on-Silicon CMOS-Compatible Process", *Power GaN Devices*, 2017, 16 pages.

\* cited by examiner

METHOD OF ETCHING A LAYER BASED ON A III-V MATERIAL

TECHNICAL FIELD

The present invention generally relates to the integration of layers with the basis of materials III-V and in particular with the basis of materials III-N such as gallium nitride (GaN) within microelectronic devices. It will have an advantageous application in producing devices such as transistors integrating one or more layers of materials III-N.

STATE OF THE ART

The search to battle energy waste and to increase needs push manufacturers of microelectronic devices to improve efficiencies and performances of the electric energy conversion systems thereof. Currently, conversion circuits are manufactured on the basis of silicon and lots of research has been carried out to develop architectures with the aim of increasing efficiency and conductivity. However, these known devices have come to the theoretical limits of silicon and new solutions must be developed.

Thanks to its electric properties allowing the formation of a two-dimensional electron gas, the AlGaN/GaN heterostructure, formed of a layer of aluminium-gallium nitride on a gallium nitride layer, has good perspectives for the development of power electronics. It competes with Si and SiC in terms of device size, voltage withstanding, mobility of carriers, as well as resistance in series.

However, the practical use of this AlGaN/GaN heterostructure, for example in a transistor or a diode has big problems that it must resolve in order to utilise all the performances of these GaN-based materials. More generally, these problems are posed for the materials III-V and in particular, the materials III-N. It has been identified, in particular, that the etching steps, for the structuring of the devices, are critical and degrade the electric properties of the channel.

These etching steps relate, for example, to the opening of a passivation layer surmounting the AlGaN/GaN heterostructure in order to form the contacts of a diode or to form the gate or the contacts for the transistors, for example HEMT transistors (High Electron Mobility Transistors).

These steps are carried out by traditional plasma etching with chlorinated chemistries, in an inductive coupling plasma (ICP) reactor.

These solutions have numerous disadvantages. In particular, the ion bombardment during the plasma etching generally leads to a degradation of the materials of the layers and patterns that are sought to be preserved. Moreover, controlling the etching depth, carried out at the same time in the absence of a stop layer, is not very precise.

All these disadvantages lead to degrading the AlGaN layer and to reducing the performances of the device.

Cyclic etching techniques have been proposed to limit these disadvantages. This type of technique has been described in patent document U.S. Pat. No. 8,124,505B1 published on 28 Feb. 2012. As indicated in this document, the cyclic etching of GaN is constituted of the two following steps:
  a first step of oxidation by an oxygen plasma. In this case, the oxidised zone is 1-3 nm.
  a second step of etching the oxide created selectively in the non-modified GaN by a $BCl_3$-based plasma.

If this technique allows to improve the control of the etched thickness and to reduce the surface damage, it has the disadvantage of inducing a significant implementation duration, duration which is not compatible with the industrial requirements in terms of productivity.

An aim of the present invention is therefore to propose a solution, allowing to etch a layer with the basis of material III-N such as GaN with precision and while limiting, even removing the disadvantages of known solutions. In particular, it would be advantageous to propose a solution allowing to etch a layer with a basis of material III-N with precision and with a reduced duration with respect to known cyclic etching solutions.

The other aims, features and advantages of the present invention will appear upon examining the following description and the supporting drawings. It is understood that other advantages can be incorporated.

SUMMARY

To achieve this aim, according to an embodiment, a method of etching at least one layer with the basis of a material III-V is provided, the method comprising at least:
  providing at least one layer with the basis of a material III-V having a front face,
  at least one cycle comprising at least the following steps:
    modifying, by implanting hydrogen (H)- and/or helium (He)-based ions, at least some of the thickness (e100) of said layer to form in said layer at least one modified portion extending from the front face, the implantation being carried out from a plasma,
    oxidising at least some of the modified portion by exposing said layer to an oxygen-based plasma, to define in said at least one oxidised portion and at least one non-oxidised portion,
    after the modification step and the oxidation step, etching the at least one oxidised portion selectively at the at least one non-oxidised portion.

Thus, the implantation of light hydrogen (H)- and/or helium-based ions allows to modify the layer with the basis of the material III-V on a relatively large thickness, typically on a thickness greater than 4 nanometres ($10^{-9}$ metres).

The oxidation is then carried out favourably and a lot quicker on the portions modified by implantation. Particularly, the oxidation is carried out on a depth which is substantially greater than in a method which does not provide any step of modifying by implanting light ions. Preferably, the whole thickness of the portions modified by implantation is oxidised.

Indeed, it has been noted that with known cyclic etching methods, the plasma is made without ion bombardment or with a very low bombardment to not spray and damage the AlGaN layer. This low bombardment obligates the thickness of the oxidised layer to be very low. It is thus necessary to repeat a large number of time, the procedure to achieve the desired thickness of etched GaN. The duration of the method is thus very long.

The etching allows to remove the oxidised portions selectively from the non-oxidised portions. The etching is stopped or has the speed thereof reduce very significantly when all the oxide is consumed. This etching is thus self-limiting. Under certain etching conditions, the selectivity of the etching of oxidised portions vis-à-vis non-oxidised portions is infinite or almost infinite.

This method allows to control, with a great precision, the depth removed from the material III-V while removing at each cycle, a significant thickness. For one same thickness of material III-V to be removed, the method proposed allows to considerably reduce the implementation duration. The solution proposed thus considerably improves the productivity of the methods of etching layers with the basis of materials III-V.

Moreover, the etched depth is homogenous over the whole surface of the layer.

Furthermore, the implantation of light ions and using a plasma allows to control with precision, the implanted depth. The zones stripped from the etching are not damaged. The devices produced from these etchings thus have improved performances.

The implantation from a plasma allows to modify the layer III-V, from the front face thereof continuously over a controlled depth. Thus, the oxidation is achieved also continuously from the front face of said layer. Moreover, the implantation from a plasma allows to obtain a good homogeneity of the modification. The oxidation will thus be controlled with precision and will also be homogenous over the whole modified depth. The etching which follows will itself also be controlled with precision.

Preferably, all of these steps are carried out in one same etching reactor. This allows to limit the number of steps and to considerably reduce the duration of the method.

Another aspect relates to a method for producing a transistor comprising the following steps:
Providing a stack comprising successively at least: one substrate, one layer with the basis of a material III-N and a mask, said layer comprising successively a GaN layer, an AlN layer and an AlGaN layer,
Etching the layer with the basis of the material III-N through the mask, by implementing the method described above, so as to form at least three trenches to the right of openings formed by the mask,
Filling the trenches to define in the trenches, at least one transistor gate, one source and one drain.

This method allows to remove with precision, the whole thickness of the AlGaN and AlN layers and by controlling the etched depth in the GaN layer. Moreover, the GaN stripped at the bottom of the trench and which is preserved is not damaged. As needed, an annealing can be provided to desorb species possibly implanted in the GaN, such as helium. The method proposed thus allows to improve the performances of the transistor obtained. Moreover, this method is reliable, easily reproducible, and inexpensive. It if furthermore compatible with the limitations of industrial productivity.

Another aspect of the description relates to a transistor comprising:
a stack comprising successively at least: one substrate, one layer with the basis of a material III-N and one mask, the layer with the basis of a material III-N comprising successively a GaN layer, an AlN layer and an AlGaN layer,
one source, one drain and one gate each extending through the whole thickness of the AlN layer and the whole thickness of the AlGaN layer to open into the GaN layer.

Another aspect relates to a microelectronic device obtained by a method implementing the above method for etching a layer with the basis of a material III-N.

By microelectronic device, this means any type of device produced with microelectronic means. These devices in particular comprise, in addition, devices with a purely electronic purpose, micromechanical or electromechanical devices (MEMS, NEMS, etc.), as well as optical or optoelectronic devices (MOEMS, etc.).

BRIEF DESCRIPTION OF THE FIGURES

The aims, objectives, as well as the features and advantages of the invention will emerge better from the detailed description of an embodiment of the latter, which is illustrated by the following supporting drawings, wherein.

Figure 1A:
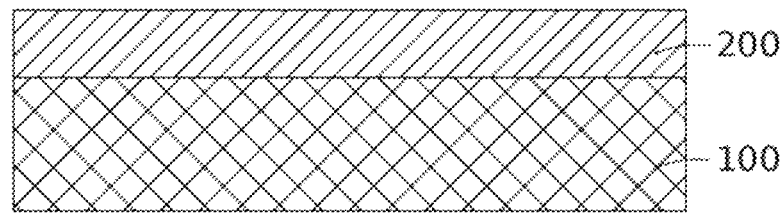
FIGS. 1A to 1E schematically illustrate the main steps of a method according to a first embodiment of the present invention.

The drawings are given as examples and are not limiting of the invention. They constitute schematic principle representations intended to facilitate the understanding of the invention and are not necessarily to the scale of practical applications. In particular, the relative thicknesses of the different layers are not representative of reality.

DETAILED DESCRIPTION

Before starting a detailed review of embodiments of the invention, optional features are stated below which can possibly be used in association or alternatively.

Preferably, the modification step, the oxidation step and the etching step being preferably carried out in one same etching reactor.

According to an example, the etching step is carried out using a plasma. According to an example, this etching step is carried out using a boron trichloride ($BCl_3$)-based plasma.

According to an example, before carrying out said cycle, the front face of the layer with the basis of a material III-N is surmounted by a mask. According to an example, the mask is nitride-based and preferably silicon nitride-based ($Si_xN_y$, x and y being non-zero integers).

According to an example, modification by implantation is carried out such that the modified portion is extended from the front face and over a depth $e110$ greater than 2 nm ($10^{-9}$ metres), preferably greater than or equal to 4 nm ($10^{-9}$ metres), with preferably 5 nm<$e110$<20 nm. This depth allows to control with a great precision, the depth removed at each cycle while allowing to remove a lot of material at each cycle. The speed of executing the method thereof is increased.

According to an example, the oxidation step is carried out so as to oxidise at least 80% of the depth of the portion modified by implantation of hydrogen- and/or helium-based ions. According to an example, the oxidation step is carried out so as to oxidise the whole modified portion. Thus, in this example, 100% of the depth of the portion modified by implantation of hydrogen- and/or helium-based ions is oxidised. Thus, the thickness oxidised at each cycle is significantly greater than the thickness which would be oxidised by implementing a method not comprising any step of modifying by implantation of light ions. The speed of executing the method thereof is increased further.

According to an example, said layer is intended to form an active layer of a transistor.

According to an example, the material III-V is a material III-N. According to an example, the material III-N is a gallium nitride (GaN)-based material.

According to an example, the material III-N is taken from among: GaN, AlGaN, InGaN, AlInGaN, AlN.

According to an example, the method comprises, after the at least one cycle, an annealing step carried out so as to desorb at least some of the hydrogen (H)- and/or helium (He)-based ions, which would remain in said layer coming from the at least one cycle.

According to an example, the method comprises a plurality of cycles and comprises, only after the last cycle, an annealing step carried out so as to desorb at least some of the hydrogen (H)- and/or helium (He)-based ions. According to an example, the annealing is carried out at a temperature of at least 500° C. Preferably, the annealing is carried out at a temperature of at least 600° C. Preferably, the annealing is carried out at a temperature less than 900° C. Preferably, the annealing is carried out for a duration of at least one minute and preferably less than 10 minutes. Preferably, the annealing is carried out for a duration of less than 45 minutes. Preferably, the annealing is carried out for a duration comprised between 10 minutes and 30 minutes.

These annealing conditions have allowed to improve in an unexpected proportion, the properties of the etched materials.

According to an example, the method comprises a plurality of cycles, the number of cycles being preferably greater than 8, preferably greater than 10 and preferably comprised between 8 and 40.

According to an example, the modification and oxidation steps are carried out using one same plasma comprising said H- and/or He-based ions and oxygen. Thus, the modification and oxidation steps are carried out simultaneously. The speed of executing the method thereof is increased further.

It is specified that in the scope of the present invention, the thickness of a layer is measured along a direction perpendicular to the surface according to which this layer has the maximum extension thereof. In the figures, the thickness is taken along the vertical. Likewise, when it is indicated that an element is situated to the right or just under another element, this means that these two elements are both situated on one same line perpendicular to the main extension plane of the layer, that is on one same line oriented vertically in the figures.

A material III-N is a material comprising at least one element of the column III and at least nitrogen (N). Likewise, a material III-V is a material comprising at least one element of the column III and at least one element of the column V.

By a substrate, a film, a layer, "with the basis" of a material A, this means a substrate, a film, a layer comprising this material A only or this material A and possibly other materials. Thus, in the present description, a layer with the basis of a material III-N can be a layer constituted exclusively of material III-N or a layer including a material III-N and other elements.

According to an example, in the scope of the present invention, a layer with the basis of a material III-N is a GaN- or AlN-based material.

A GaN-based layer can be a layer constituted exclusively of GaN. Alternatively, it can be constituted of GaN and one or more elements of the column III or of the column V of the periodic table of elements, even or other elements, which are for example, involuntarily present and which can possibly originate from undesired implantation. Typically, it can be an AlaN, InGaN or AlInGaN layer.

According to an example, the layer of material III-N is doped. The doping can be carried out with at least one of the following species: Mg, Si, P, O, Ca, C. A layer can moreover be composed of several sublayers of one same material or of different materials. Thus, a layer with the basis of a material III-N can comprise a stack of several layers with the basis of a material III-N. In particular, a GaN-based layer can be a stack of GaN-based layers. The stack can, for example, comprise an AlGaN layer situated on, preferably directly in contact with a layer made of GaN.

In the present description, a SixNy-based material and x and y, non-zero integers, can, for example, be one of the following materials: SiN, $Si_3N_4$, SiOCN, SiCBN.

The word "dielectric" qualifies a material of which the electric conductivity is sufficiently low in the given application to be used as electric insulator.

It is specified that, in the scope of the present invention, the terms "on", "surmounts", "covers", "underlying", "opposite" and the equivalents thereof do not necessarily mean "in contact with". Thus, for example, the deposition, the extension, the gluing, the assembly or the application of a first layer on a second layer, does not compulsorily mean that the two layers are directly in contact with one another, but means that the first layer covers at least partially the second layer by being either directly in contact with it, or by being separated from it by at least one other layer or at least one other element.

The term "step" does not compulsorily mean that the actions carried out during a step are simultaneous or immediately successive. Certain actions of a first step can in particular be followed by actions linked to a different step, and other actions of the first step can be then resumed. Thus, the term "step" does not necessarily extend from single and inseparable actions over time and in the sequence of the phases of the method.

A first embodiment will now be described in detail in reference to FIGS. 1A to 1E and 2.

A preliminary step consists of providing a layer 100, for example with the basis of at least one material III-V, preferably with the basis of at least one material III-N. Typically, this material is GaN-based. This method is also applied to materials other than the materials III-N or III-V. This layer 100 can be formed of one single layer. It can also be formed of a stack of layers 100a, 100b, 100c as will be described in reference to FIGS. 6A to 7. The layer 100 can rest on a substrate, typically a support or growth substrate (not illustrated in FIGS. 1A to 1E). One or more of the intermediate layers can be arranged between the substrate and a rear face 102 of the layer 100. According to an embodiment, this layer 100 is intended to form the active layer of a transistor.

Moreover, in order to etch only certain zones of the layer 100, it can be provided to form a mask 210 surmounting the layer 100. The presence of this mask 210 is however not compulsory to implement the etching method described below.

Figure 1B:
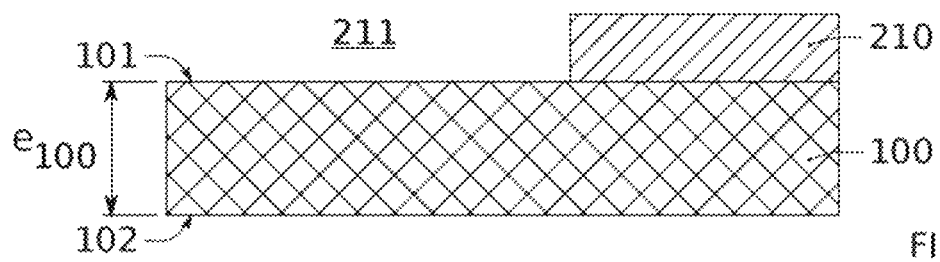

According to an example, the mask 210 is arranged directly in contact with a front face 101 of the layer 100. The mask 210 is, for example, formed by lithography of a layer 200 arranged or extended on the layer 100. Preferably, the mask 210 is a hard mask. It is, for example, formed with an SixNy base with x and y, non-zero integers. The following materials can be mentioned, for example, for forming the hard mask 210: SiN, $Si_3N_4$, SiOCN, SiCBN. The mask 210 has openings 211 as illustrated in FIG. 1B.

Then, at least one cycle is carried out, of which the steps will be described below.

Figure 1C:
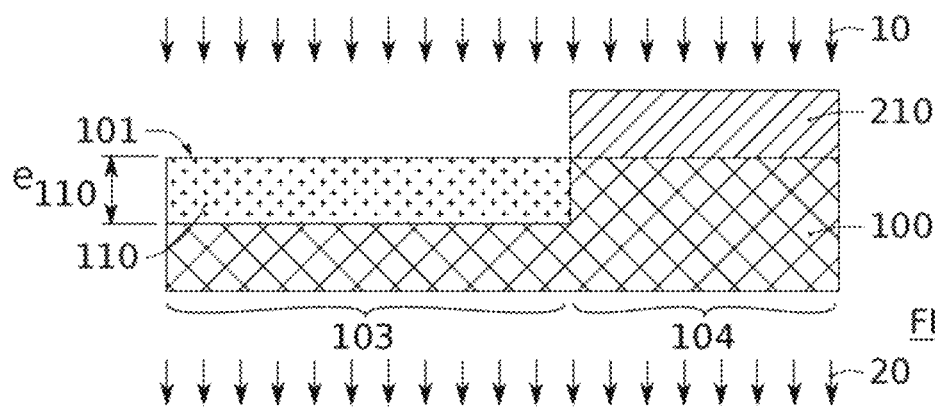

1st Step of the Cycle: Modification of the Layer With the Basis of Material III-N A first step of the cycle aims to modify the layer 100 by implanting light ions there using a plasma. This step is illustrated in FIG. 1C.

The parameters of the plasma, in particular, the nature of the ions, the energy of the ions and the dose implanted are adjusted so as to modify the layer 100 without etching it, nor even spraying it. Thus, this is essentially or mainly a chemical modification, the addition of ions in this layer 100 changing the selectivity thereof. Thus, the modified portions 110 of this layer 100 will be oxidised a lot more easily than the non-modified portions.

Preferably, this implantation 10 of ions is done with a solid plate, through the mask 210 if it is present.

The implantation 10 is adjusted such that the ions are implanted along a favoured direction, perpendicular to the plane wherein the layer 100 mainly extends.

Thus, below 103 the openings 211 of the mask 210, the layer 100 is modified over a depth e110. And, below 104 the non-open portions of the mask 210, the layer 100 is not modified by the implantation.

Preferably, the implantation depth e110, and therefore the thickness of the modified portions 110 is greater than 4 nm, and preferably greater than 5 nm. Preferably, 5 nm<e110<20 nm. Preferably, 10 nm<e110<20 nm. On thicknesses less than 20 nm, it is indeed easy to control with precision the implantation depth using a light ion plasma and to obtain a continuous even homogenous modification over the whole implanted depth.

Typically, this modification comprises the implantation of hydrogen (H, $H^+$, $H_2^+$, $H_3^+$, etc. . . . )-based ions. According to another embodiment, the ions implanted are helium (He) ions or a mixture of helium and hydrogen (H/He) ions. These ions can originate, for example, from the following gases introduced in the reactor: $H_2$, HBr; $NH_3$.

This implantation 10 is, for example, achieved in an etching reactor, for example an inductive coupling plasma (ICP) reactor.

Non-limiting examples of parameters used for this implantation 10 will be described below.

2nd Step of the Cycle: Oxidation of the Modified Portions

Figure 1D:
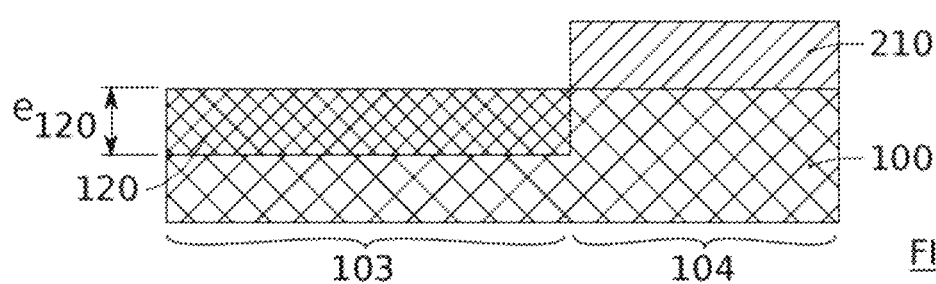

A second step of the cycle aims to oxidise the portions modified 110 by the implantation 10. This step is illustrated in FIG. 1D.

This oxidation 20 is carried out so as to oxidise the modified portions 110 preferably at the non-modified portions of the layer 100. Preferably, only the modified portions 110 are oxidised. Preferably, this oxidation 20 is configured so as to oxidise the modified portions 110 over more than half of the depth e110 thereof, preferably over at least 80% of the depth e110 thereof, and even more preferably, over the whole of the depth e110 thereof. FIG. 1D illustrates the case where the thickness e110 of the modified portion 110 is oxidised. This allows to remove, in a perfectly controlled manner, a significant thickness of the material to be etched.

Coming from the oxidation 20, the layer 100 thus has oxidised portions 120 and non-oxidised portions. Preferably, the oxidised portions 120 are situated below 103 the openings 211 of the mask 210. The non-oxidised portions are situated below 104 the non-open zones of the mask 210.

This oxidation 20 is carried out using an oxygen-based plasma. Preferably, this oxidation 20 carried out in the same reactor as that being used for the implantation 10.

Non-limiting examples of parameters used for this oxidation 20 will be described below.

3rd Step of the Cycle: Etching Modified Portions

Figure 1E:
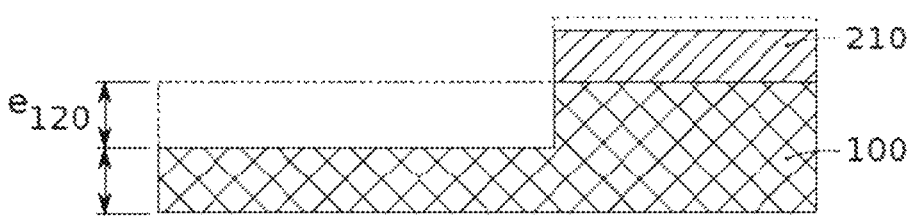

A third step of the cycle aims to etch selectively the modified portions 120 vis-à-vis non-modified portions of the layer 100. This step is illustrated in FIG. 1E.

According to an example, this selective etching is carried out from a boron trichloride ($BCl_3$)-based plasma.

The parameters of the etching are preferably adjusted so as to remove the whole thickness e120 of the modified portions 120.

Thus, only the portions of the layer 100 situated below 103 the openings 211 of the mask 210 are etched.

This cycle of steps comprising at least the implantation 10, the oxidation 20 and the etching can be repeated several times until the total etched thickness e120 corresponds to the depth that is sought to be removed in the layer 100.

Figure 2:
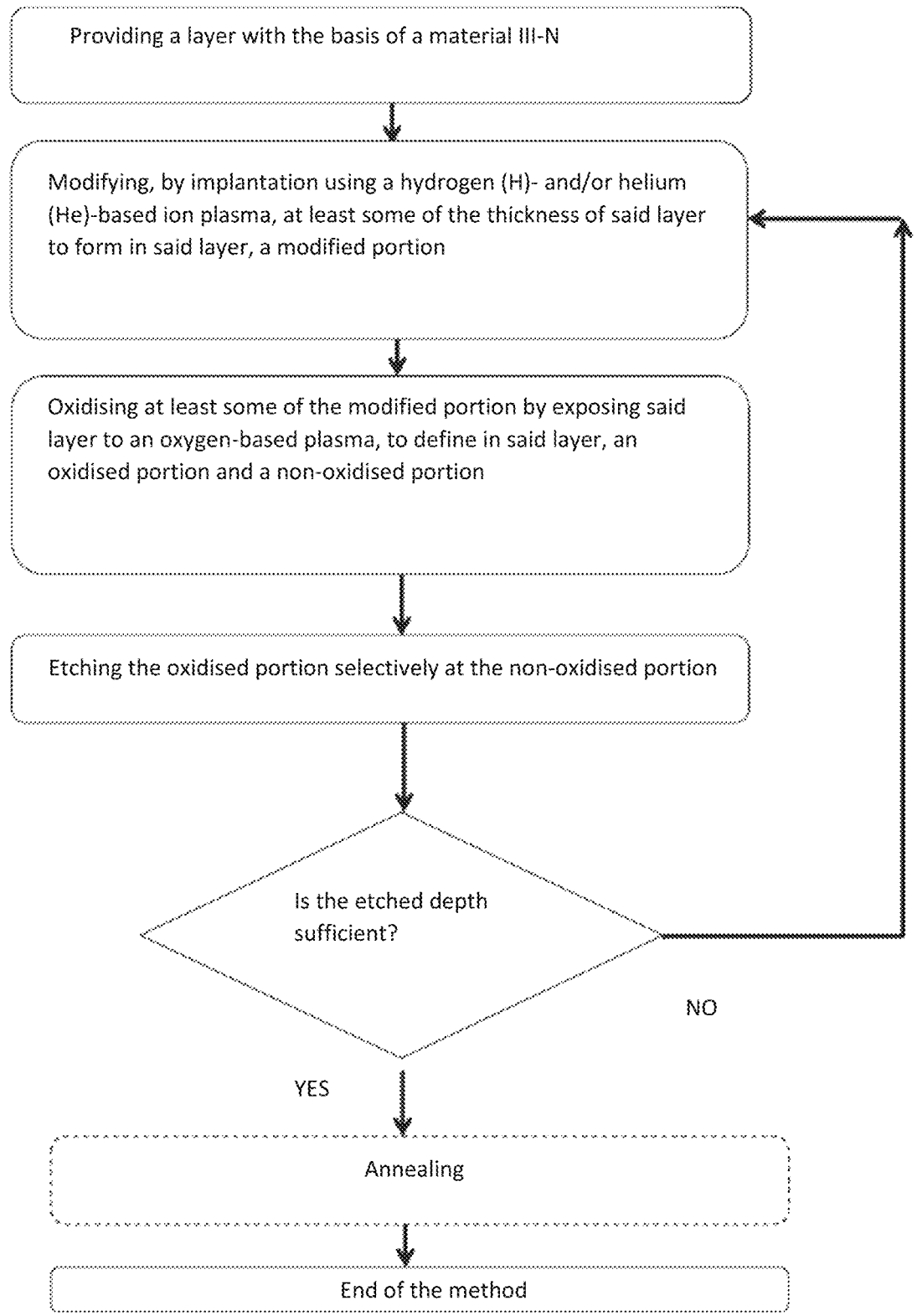
FIG. 2 represents, in the form of a flowchart, the main steps of a method according to the embodiment illustrated in FIG. 1.

This repetition of the cycle is illustrated in the flowchart of FIG. 2.

For example, to etch between 20 and 110 nm of the layer 100, between 5 and 28 cycles are carried out.

With the method described above, a significantly high speed for etching the layer 100 is obtained, while preserving a very precise control of the etched depth. Indeed, the etching is stopped when all the oxide is consumed.

Furthermore, this method has a good selectivity of the etching of the layer 100 with respect to the mask 210. The mask 210 is etched, but at a lower speed than the layer 100. Thus, the thickness etched in the mask 210 is less than the thickness e120 etched in the layer 100, as is illustrated in FIG. 1E.

With cycles of oxidation then etching by a $BCl_3$ solution, the SiN is etched at a speed of 0.8 nm/cycle compared with 1.6 nm/cycle for the layer 100 made of GaN. With cycles each comprising an implantation by He species, then an oxidation, then etching by a $BCl_3$ solution, the etching of the SiN is also accelerated. It is therefore necessary to consequently size the initial thickness of the mask 210.

Preferably, each of the steps of the cycle is carried out in the same etching reactor. This allows to reduce the number of steps and to reduce the total duration of the method. Moreover, this avoids having to remove the layer 100 of an item of equipment which would lead to a higher risk of contamination.

Optionally, an annealing is carried out. This annealing aims, in particular to cause a desorption of helium- or hydrogen-based light ions. This allows to improve the performances of the device comprising the etched layer 100 and in particular, the layer resistance $R_{sheet}$. Preferably, this annealing is carried out only once, coming from the last cycle.

Figure 3:
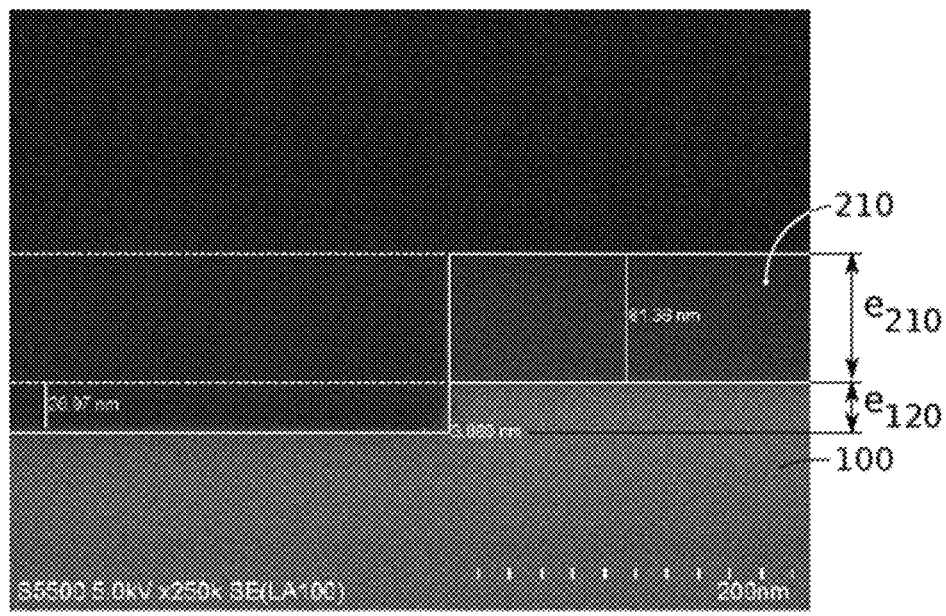
FIG. 3 is a photo of the result obtained after implementation of a method according to the state of the art.
Figure 4:
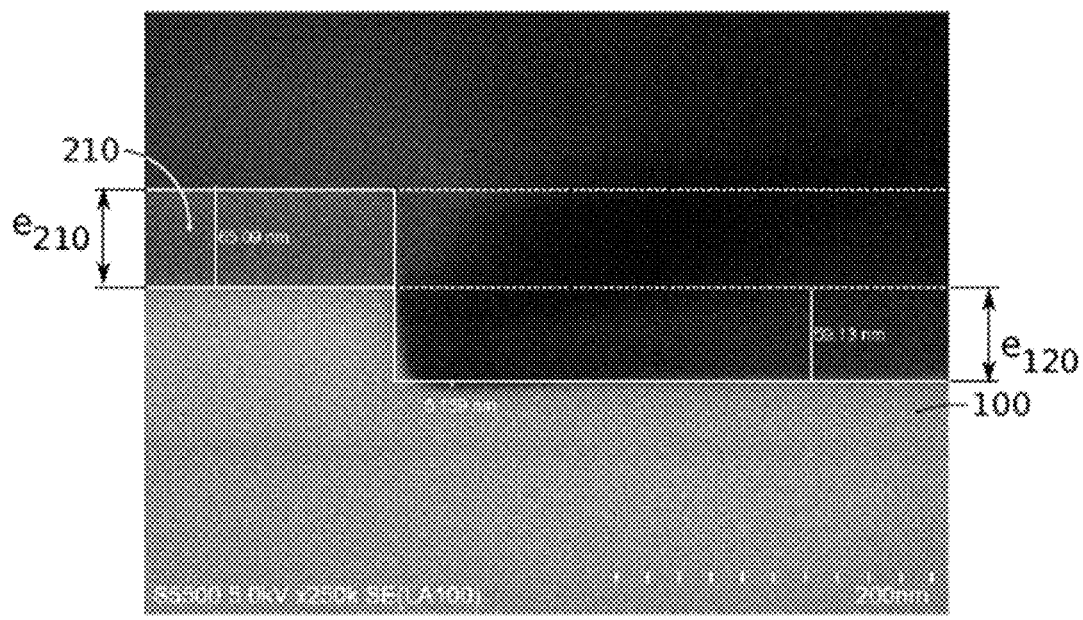
FIG. 4 is a photo of the result obtained after implementation of an example of a method according to the invention.

FIGS. 3 and 4 are photos, cross-sectional, showing the etching of a GaN layer 100, surmounted by a hard mask 210 of SiN.

FIG. 3 illustrates the result obtained by implementing a cyclic etching method comprising for each cycle, an oxidation and an etching without implantation prior to the oxidation, the etching being carried out using a $BCl_3$-based solution. At the end of 15 cycles, the layer 100 is etched over a depth e120 of 29 nm. During each of these cycles, the duration of the oxidation is 30 seconds and the duration of the etching is 15 seconds.

FIG. 4 illustrates the result obtained by implementing a cyclic etching method, such as that described above. At the end of 15 cycles each comprising an implantation of helium-type light ions, followed by an oxidation 20 by an oxygen plasma then an etching using a $BCl_3$-based solution, the layer 100 is etched over a depth e120 of 59 nm. During each of these cycles, the duration of the implantation 10 is 30 seconds, the duration of the oxidation 20 is 30 seconds and the duration of the etching is 15 seconds. In this example, the bias voltage used during the implantation is 33V.

By using the same conditions, but with a bias voltage of 7V and a duration of implantation of 15V, an etching depth of 41 nm is obtained.

With a conventional method, wherein each cycle comprises an oxidation then an etching with a $BCl_3$ solution: the etching depth is 1.6 nm/cycle. Each cycle comprises the following steps: 10 s of stabilisation (also called purge), 30 s of injecting $O_2$, 10 s of stabilisation, 15 s of injecting $BCl_3$. The total duration is 65 s and allows to obtain an etching speed of 1.5 nm/min.

With a method according to the invention including an injection of He for 30 s, an etching speed of 4 nm/cycle is obtained. Each cycle comprises the following steps: 10 s of stabilisation, 30 s of injecting He, 10 s of stabilisation, 30 s of injecting $O_2$, 10 s of stabilisation, 15 s of injecting $BCl_3$. The total duration is 105 s and allows to obtain an etching speed of 2.3 nm/min.

With a method according to the invention including an injection of He for 15 s, an etching speed of 2.7 nm/cycle is obtained. Each cycle comprises the following steps: 10 s of stabilisation, 15 s of injecting He, 10 s of stabilisation, 30 s of injecting $O_2$, 10 s of stabilisation, 15 s of injecting $BCl_3$. The total duration is 90 s and allows to obtain an etching speed of 1.8 nm/min.

Regarding the examples above, it clearly emerges that the method according to the invention allows to increase the etching speed. The most significant improvement in terms of etching speed relates to the embodiment, wherein He is injected for 30 s.

If the stabilisation steps are not considered, the differences in etching speed are further accentuated. With a conventional method without prior oxidation implantation, the etching speed is 2.1 nm/min. With a method according to the invention, the etching speed is 3.2/min with injection of He for 30 seconds and is 2.7/min with injection of He for 15 seconds.

At each cycle, the etched depth is more significant in the case of the method according to the invention that in the case of a method not comprising any prior implantation step. Despite the addition of the implantation step 10, the etching speed is considerably increased.

Thus, for one same etched depth, the invention allows to very highly reduce the number of cycles and the time of the method. Moreover, with the number of cycles being reduced, certain steps are removed, such as steps of purging the reactor which allows to further reduce the total duration of the method.

The implantation step 10 and the oxidation step 20 can, at each cycle, be carried out successively. It is this embodiment which is illustrated in FIGS. 1C and 1D and in FIG. 2. In this embodiment, it can, for example, be provided to introduce in a reactor, firstly, first gases allowing the implantation 10 of light ions then, secondly, to stop the introduction of these first gases allowing the oxidation 20.

This embodiment has very significant advantages. Indeed, the implantation of hydrogen- and/or helium-based ions, carried out before the oxidation step, allows to adapt the parameters of the implantation so as to obtain a significant implantation depth as well as a good control of the critical dimensions and of the profile of the zone to be etched. Typically, the energy of the ions can be increased such that they are implanted over a significant depth without risking spraying the layer to be etched. For example, a significant bias voltage or power can be provided to obtain an implantation depth e110 greater than 3 nanometres, preferably greater than or equal to 4 nanometres and preferably comprised between 5 and 20 nm, even 100 nanometres. With such a bias voltage or power, the presence of oxygen ions would cause a spraying of the layer to be etched. This spraying would degrade the profile of the bottom of the implanted region. When this implanted region opens out over an underlying layer where this underlaying layer is situated in the proximity, the spraying could degrade this underlying layer. Moreover, this spraying would modify the profile, edges of the region to be etched. Indeed, this spraying of the etched material would modify the surface condition of the edges. Moreover, this spraying would cause a redeposition of material on the edges and/or on the hard mask, disrupting, due to this, the control of the profile.

Figure 5:
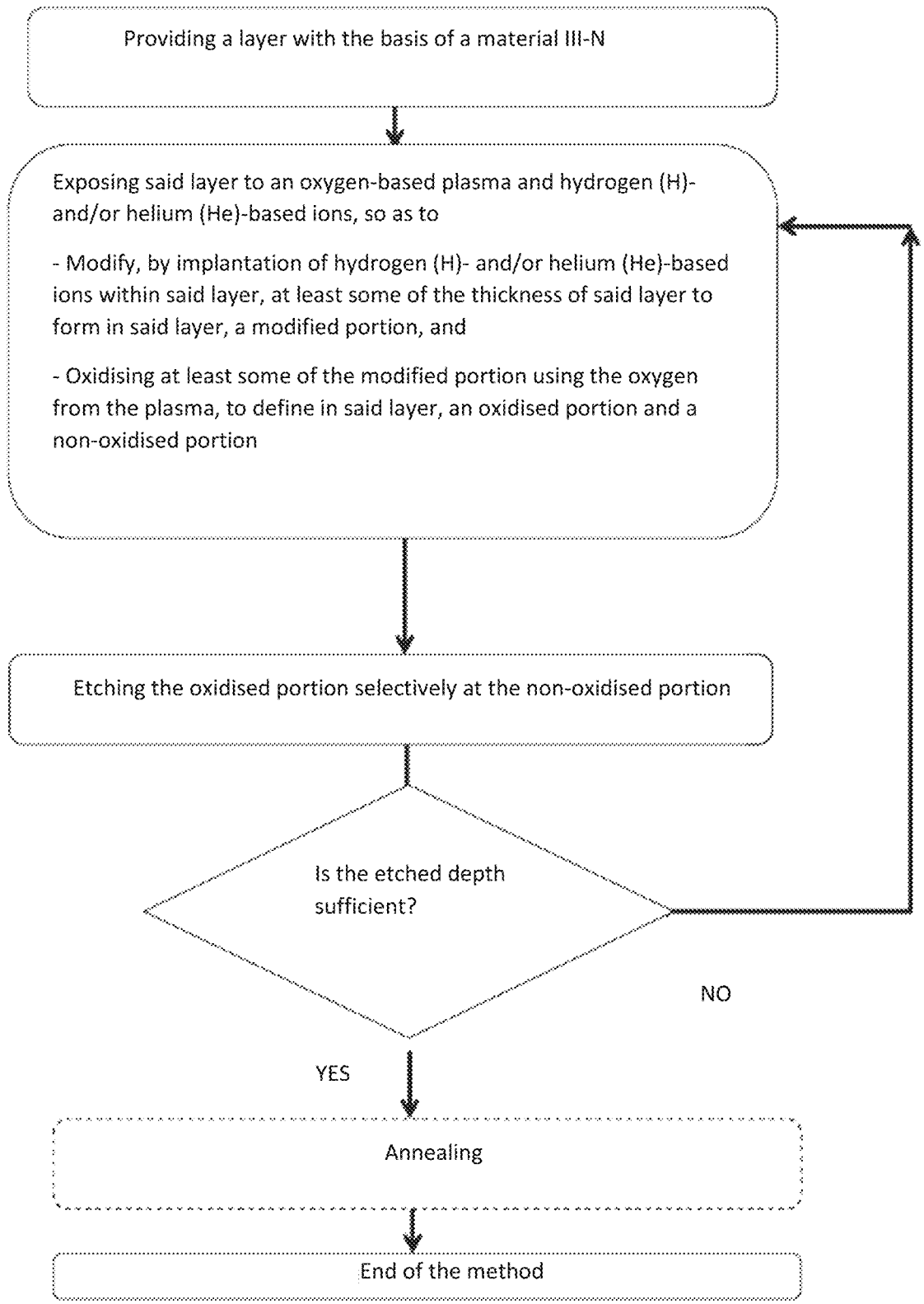
FIG. 5 represents, in the form of a flowchart, the main steps of a method according to an alternative embodiment.

According to an alternative embodiment, illustrated in FIG. 5, the implantation 10 and the oxidation 20 are carried out from one same plasma. Thus, the reactor comprises, within itself, simultaneously the first gases allowing the implantation 10 of the light ions, as well as the second gases allowing the oxidation 20. For example, simultaneously, these first and second gases are introduced. While the light ions are implanted in the portions 110 of the layer 100, the oxidation favourably occurs on these portions 110.

The method described above also has advantages relating to the layer resistance $R_{sheet}$.

Indeed, it has proved to be that the stack of the layer III-V, in particular the stack formed of the superposition of an AlGaN layer and of a GaN layer (with possibly an AlN layer), has an electron channel having a resistance $R_{sheet1}$ coming from the method described above significantly less than the resistance $R_{sheet2}$ of the electron channel for this same structure obtained coming from a cyclic etching method without implantation prior to the oxidation. Before annealing, $R_{sheet1}$ is greater than $R_{sheet2}$. The annealing allows to improve $R_{sheet1}$ in a proportion which is absolutely surprising in the case of the method according to the invention. Indeed, not only does the annealing allow to improve $R_{sheet1}$ so as to reach $R_{sheet2}$, but in addition, it allows to significantly exceed it.

Typically, with the method described above, wherein the bias voltage during the He injection is 7V, and wherein He is injected for 15 seconds $R_{sheet1}$=1.41 while $R_{sheet2}$=2.04. These resistance values $R_{sheet1}$ are measured after annealing. These resistance values $R_{sheet}$ relate to a value of a reference. A value of 1 means that there is no degradation. A value greater than 1 means that there is an increase in the resistance of the electron channel, and therefore a degradation of the performances of the transistor comprising this channel.

It is reminded that the layer resistance, usually designated by $R_{sheet}$ is expressed in $\Omega/\square$ or $\Omega.m$. The layer resistance $R_{sheet}$ is measured, for example, by the known four-tip method. An example of this well-known method is, for example, described in patent application EP3023799A1 published on 25 May 2016 and mentioning as inventors C. Leroux and J. LEHMANN.

Figure 6A:
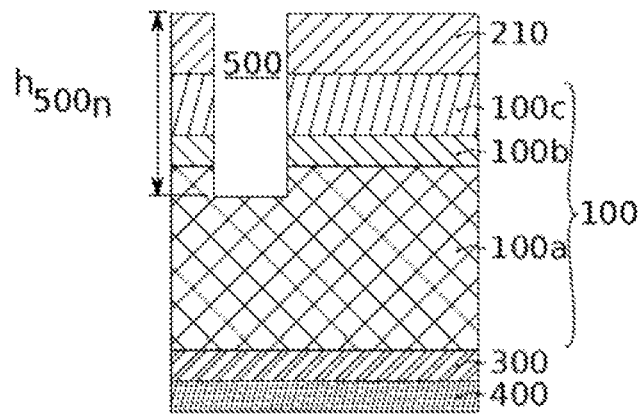
FIGS. 6A to 6C schematically illustrate certain steps applied to a structure wherein the layer of material III-N is a stack of several layers.

In reference to FIGS. 6A to 7, a particular embodiment will now be described.

In this embodiment, the layer 100 comprises a plurality of layers each with the basis of a material III-N. In this non-limiting example, the layer 100 comprises, successively arranged from a substrate 400, a GaN layer 100a, an AlN layer 100b, and an AlGaN layer 100c.

In this example, a buffer layer 300 is arranged between the layer 100 and the substrate 400.

The layer 100 is surmounted by a mask 210, for example made of SiN.

One and preferably n implantation 10/oxidation 20/etching cycles are implemented to etch a trench 500 through an opening of the mask 210, with n greater than or equal to 2. At the end of these n cycles, this trench is extended through the whole thickness of the layer 100c and of the layer 100b and of only some of the thickness of the layer 100a. This trench 500 has a depth $h_{500_{0n}}$, such as referenced in FIG. 6A.

Figure 6B:
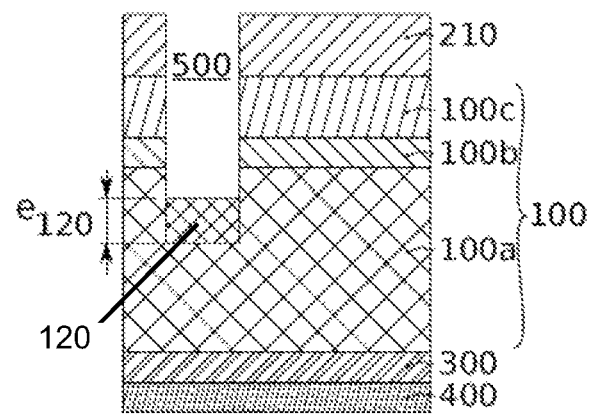

FIG. 6B illustrates the result obtained after the implantation step 10 through the mask 210 then the oxidation step 20 of an additional cycle n+1. The portion 120 of the layer 100 is oxidised over a depth e120.

Figure 6C:
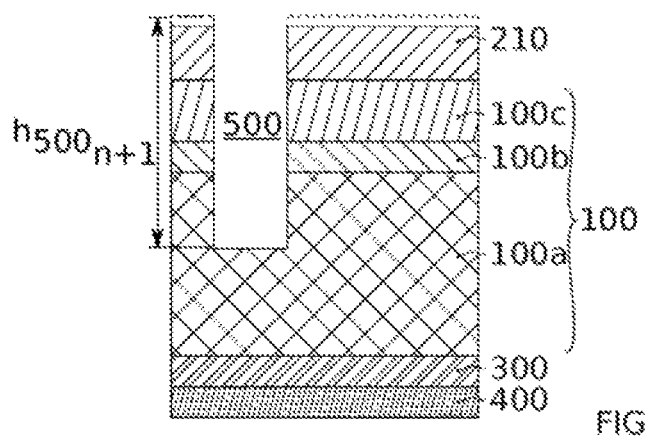

FIG. 6C illustrates the result obtained after the etching step of this additional cycle. The portion 120 is removed. The depth of the trench 500 increases from e120 and becomes $h_{500n+1}$.

This trench 500 can then be filled, for example one or more materials, to form functional portions of a microelectronic device.

Figure 7:
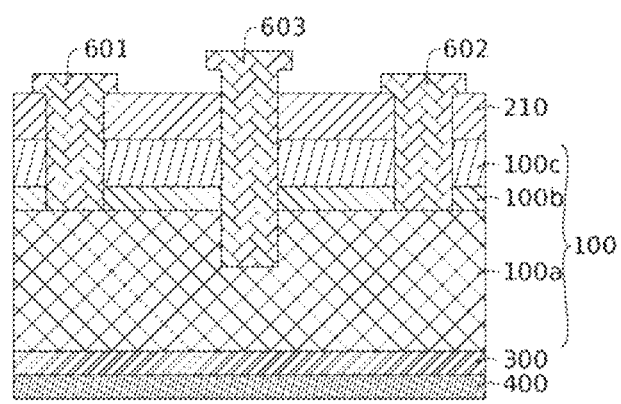
FIG. 7 is a schematic illustration of the microelectronic device obtained after filling openings carried out by etching in the layer of material III-N represented in FIG. 6A to 6C.

As illustrated in FIG. 7, the trench 500 can be filled to form a gate 603. Other trenches, for example shallower and extending only through the layers 100b and 100c, can be filled to form a source 601 and a drain 602. In this example, the layer 100a forms the active layer of a transistor.

Naturally, a multitude of other microelectronic devices can be formed from etchings of the layer 100.

In this example, the stack is of the AlGaN/AlN/GaN type. The AlN layer is used to improve the confinement of the electrons in the two-dimensional channel. The thickness of the AlN is preferably less than 1 nm. A stack can also be used without AlN.

Non-Limiting Example of an Embodiment

A non-limiting example of an embodiment will now be described in detail.

Mask 210: The mask 210 is a hard mask made of silicon nitride (SiN) deposited at a temperature greater than 500° C. The thickness e210 thereof is comprised between 50 and 100 nm. It is preferably 80 nm. Layer 100 with the basis of a material III-V: The layer 100 is formed of a stack comprising an AlGaN layer surmounting a GaN layer. An AlN layer, preferably thin, advantageously covers the AlGaN layer. The thickness to be etched within the layer 100 is comprised between 20 and 110 nm.

Preferably, the step of modifying by implantation 10, the oxidation step 20 and the etching step are carried out in an inductive coupling plasma for reactive ion etching (ICP-RIE) reactor.

Modification Step:

During the modification step, the plasma is a plasma formed from at least one of the following gases: $H_2$, He. It can also be an H-based plasma, obtained for example from $NH_3$ or HBr gases. In this case, the bias voltage must be reduced to avoid spraying the AlN layer which advantageously has a low thickness.

Generally, the value of the bias voltage must be adjusted with precaution, in order to avoid a spraying of the implanted layers, that these layers are, for example, made of AlGaN, GaN or AlN. This precaution relating to the bias voltage must be taken quite specifically with gases of the $NH_3$ or HBr type, but also with lighter species, such as $H_2$ or He.

The flow of the species is comprised between 10 sccm and 1000 sccm (cubic centimetres per minute), preferably between 50 sccm and 150 sccm.

The pressure is comprised between 5 mTorr and 100 mTorr, preferably between 5 mTorr and 50 mTorr.

The power of the source is comprised between 100 W and 5000 W and preferably between 500 W and 1500 W.

The bias voltage is comprised between 10V and 100V. It is preferably comprised between 20V and 50V. This parameter conditions the implantation depth of the ions and allows to adjust the speed of the method.

The temperature of the substrate on which the layer 100 rests is less than 120° C. Such a temperature allows to make the modification by implantation 10 more effective.

The duration of this step of modifying by implantation is comprised between a few seconds (typically 3 seconds) and several hundred seconds. This duration is preferably comprised between 10 s and 60 s.

Oxidation Step:

For the oxidation step, the plasma is an oxygen plasma. The gas introduced in the reactor is $O_2$.

The species are introduced in the reactor with a flow comprised between 10 sccm and 1000 sccm, preferably between 10 sccm and 500 sccm.

The pressure is comprised between 5 mTorr and 100 mTorr. The power of the source is comprised between 100 W and 5000 W, preferably between 500 W and 1500 W.

The bias voltage is comprised between 0V and 50V. It is preferably less than 30V.

The temperature of the substrate is less than 120° C. The duration of this oxidation step is comprised between a few seconds (typically 3 seconds) and several hundred seconds. This duration is preferably comprised between 10 s and 60 s.

Step of Removing the Oxidised Layer:

For the etching step, the plasma is a $BCl_3$-based plasma.

The species are introduced in the reactor with a flow comprised between 10 sccm and 1000 sccm, preferably between 10 sccm and 60 sccm.

The pressure is comprised between 5 mTorr and 100 mTorr.

The power of the source is comprised between 100 W and 5000 W, preferably between 500 W and 1500 W.

The bias voltage is comprised between 0V and 50V. It is preferably less than 30V.

The temperature of the substrate is less than 120° C.

The duration of this oxidation step is comprised between a few seconds (typically 3 seconds) and several hundred seconds. This duration is preferably comprised between 10 s and 60 s.

For example, to etch GaN at a speed of 4 nm/cycle, the conditions indicated in the table below will be selected:

TABLE 1

| Gas injected | Power of the source | Bias power | Pressure | He flow | $O_2$ flow | $BCl_3$ flow | Bias voltage | Time |
|---|---|---|---|---|---|---|---|---|
| He | 1000 W | 33 W | 10 mT | 100 sccm | | | 30 V | 30 s |
| $O_2$ | 1000 W | 20 W | 10 mT | | 50 sccm | | 30 V | 30 s |
| $BCl_3$ | 1000 W | 7 W | 10 mT | | | 50 sccm | 10 V | 15 s |

The bias power can be increased, in order to increase the implanted depth.

An annealing step can, preferably coming from the last cycle, be carried out. The annealing conditions can be as follows: Temperature of 600° C., duration of 20 minutes, under $N_2$ atmosphere, at atmospheric pressure.

In view of the description above, it clearly seems that the method proposed allows to remove with precision, a thickness of layer of material III-N, without altering the remaining portions of this layer or an underlying layer.

The method proposed thus allows to improve the performances of the devices with the basis of material III-V such as the materials III-N as those GaN-based. Moreover, this method is reliable, easily reproducible and inexpensive. It is furthermore compatible with the limitations of industrial productivity.

The invention is not limited to the embodiments described above and extends to all the embodiments covered by the claims.

The invention claimed is:

1. A method for etching at least one layer of a gallium nitride (GaN)-based material, the method comprising:
   providing at least one GaN-based layer having a front face;
   at least one cycle comprising the following successive steps:
      modifying, by implanting hydrogen (H)- and/or helium (He)-based ions, at least some of a thickness of the at least one GaN-based layer to form in said layer at least one modified portion extending from the front face, the implanting being carried out from a plasma, the modifying by implanting being carried out such that the at least one modified portion extends from the front face and over a depth greater than 3 nm,
      oxidizing at least some of the at least one modified portion by exposing said layer to an oxygen-based plasma, to define in said layer, at least one oxidized portion and at least one non-oxidized portion, and
      etching the at least one oxidized portion selectively at the at least one non-oxidized portion; and
   after the at least one cycle, performing an annealing step to desorb at least some of the hydrogen (H)- and/or helium (He)-based ions.

2. The method according to claim 1, wherein the etching step is carried out using the plasma.

3. The method according to claim 2, wherein the modifying step, the oxidizing step, and the etching step are carried out in one same etching reactor.

4. The method according to claim 1, wherein the etching step is carried out using a boron trichloride ($BCl_3$)-based plasma.

5. The method according to claim 1, wherein before carrying out the at least one cycle, the front face of the GaN-based layer is surmounted by a mask.

6. The method according to claim 5, wherein the mask is nitride-based.

7. The method according to claim 5, wherein the mask is silicon nitride $Si_xN_y$-based, x and y being non-zero integers.

8. The method according to claim 1, wherein the modifying by implanting is carried out such that the at least one modified portion extends from the front face and over a depth greater than 4 nm.

9. The method according to claim 1, wherein the modifying by implanting is carried out such that the at least one modified portion extends from the front face and over a depth, e110, such that 5 nm<e110<20 nm.

10. The method according to claim 1, wherein the oxidizing step is carried out so as to oxidize at least 80% of a depth of the at least one modified portion.

11. The method according to claim 1, wherein the oxidizing step is carried out so as to oxidize the whole modified portion.

12. The method according to claim 1, wherein the GaN-based material is chosen from among GaN, AlGaN, InGaN, and AlInGaN.

13. The method according to claim 1,
   wherein the at least one cycle comprises a plurality of cycles, and
   wherein only after the last cycle of the plurality of cycles, the annealing step is performed at a temperature of at least 500° C. to desorb at least some of the hydrogen (H)- and/or helium (He)-based ions.

14. The method according to claim 1, further comprising a plurality of cycles, the number of cycles being greater than 8.

15. The method according to claim 14, further comprising a plurality of cycles, the number of cycles being between 8 and 40.

16. The method according to claim 1, wherein the modifying and oxidizing steps are carried out using one same plasma comprising the hydrogen (H)- and/or helium (He)-based ions and oxygen.

17. A method for producing a transistor, comprising the following steps:
   providing a stack comprising successively at least: one substrate, one layer with a basis of a III-N material, and one mask, the one layer comprising successively a GaN layer, an AlN layer, and an AlGaN layer in contact with the one mask;
   etching the one layer through the mask, by implementing the method according to claim 16, so as to form at least three trenches below to openings formed by the mask; and
   filling the at least three trenches to define at least one transistor gate, one source, and one drain.

* * * * *